US011062946B2

(12) United States Patent
Dutta et al.

(10) Patent No.: US 11,062,946 B2
(45) Date of Patent: Jul. 13, 2021

(54) SELF-ALIGNED CONTACT ON A SEMICONDUCTOR DEVICE

(71) Applicant: INTERNATIONAL BUSINESS MACHINES CORPORATION, Armonk, NY (US)

(72) Inventors: Ashim Dutta, Menands, NY (US); Jennifer Church, Troy, NY (US); Ekmini A. de Silva, Singerlands, NY (US); Luciana M. Thompson, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 26 days.

(21) Appl. No.: 16/183,787

(22) Filed: Nov. 8, 2018

(65) Prior Publication Data

US 2020/0152514 A1    May 14, 2020

(51) Int. Cl.
*H01L 21/768* (2006.01)
*H01L 21/311* (2006.01)
*H01L 29/78* (2006.01)
*H01L 29/66* (2006.01)
*H01L 21/321* (2006.01)

(52) U.S. Cl.
CPC .. *H01L 21/76897* (2013.01); *H01L 21/31111* (2013.01); *H01L 21/3212* (2013.01); *H01L 21/76802* (2013.01); *H01L 29/66795* (2013.01); *H01L 29/785* (2013.01)

(58) Field of Classification Search
CPC ............ H01L 29/66795; H01L 29/785; H01L 21/76897; H01L 21/76802
See application file for complete search history.

(56) References Cited

U.S. PATENT DOCUMENTS

| 7,951,424 | B2 | 5/2011 | Afzali-Ardakani et al. |
| 8,084,311 | B1 | 12/2011 | Horak et al. |
| 8,436,404 | B2 | 5/2013 | Bohr et al. |
| 8,715,811 | B2 | 5/2014 | Masuda et al. |

(Continued)

FOREIGN PATENT DOCUMENTS

| JP | 6048932 B2 | 12/2016 | |
| WO | 2012/090789 A1 * | 12/2010 | ............ H01L 21/70 |

OTHER PUBLICATIONS

Japanese Application No. 6048932; Date of Publication: Dec. 21, 2016; Machine Translation; 29 pages.

(Continued)

*Primary Examiner* — Khaja Ahmad
*Assistant Examiner* — Khatib A Rahman
(74) *Attorney, Agent, or Firm* — Cantor Colburn LLP; Randall Bluestone (57) ABSTRACT

A method for forming one or more self-aligned contacts on a semiconductor device includes applying a protective layer on an oxide surface above a source and drain of the semiconductor device. The protective layer covers a top surface of the oxide surface selective to nitride above a gate contact pillar. A sacrificial layer is applied to the nitride surface. The sacrificial layer is deposited only on the nitride surface that is selective to the oxide layer coated with the protective layer. The protective layer is removed from the oxide surface and source/drain contact holes are etched in the oxide surface to form self-aligned contacts on the semiconductor device.

18 Claims, 6 Drawing Sheets

(56) References Cited

U.S. PATENT DOCUMENTS

| | | | |
|---|---|---|---|
| 8,753,970 B2* | 6/2014 | Xie | H01L 21/823437 |
| | | | 438/595 |
| 9,064,801 B1 | 6/2015 | Horak et al. | |
| 9,607,725 B2 | 3/2017 | Sandhu | |
| 9,659,816 B2* | 5/2017 | Hieno | B82Y 30/00 |
| 9,701,760 B2 | 7/2017 | Kumada et al. | |
| 9,768,086 B2 | 9/2017 | Nuzzo et al. | |
| 2008/0283489 A1 | 11/2008 | Burdinski et al. | |
| 2009/0118142 A1* | 5/2009 | Kuroda | C07K 14/21 |
| | | | 506/32 |
| 2011/0045538 A1* | 2/2011 | Kumada | C12N 11/08 |
| | | | 435/69.6 |
| 2011/0156107 A1* | 6/2011 | Bohr | H01L 21/28229 |
| | | | 257/288 |
| 2013/0034708 A1* | 2/2013 | Ryu | H01L 21/6715 |
| | | | 428/212 |
| 2014/0065645 A1* | 3/2014 | Han | C07K 16/46 |
| | | | 435/7.72 |
| 2014/0151637 A1* | 6/2014 | Xiao | H01L 29/7783 |
| | | | 257/24 |
| 2014/0206110 A1* | 7/2014 | Lee | G01N 21/33 |
| | | | 438/16 |
| 2015/0243739 A1* | 8/2015 | Chen | H01L 21/845 |
| | | | 257/623 |
| 2015/0311082 A1* | 10/2015 | Bouche | H01L 21/76895 |
| | | | 257/288 |
| 2017/0047253 A1* | 2/2017 | Park | H01L 21/823821 |
| 2017/0222045 A1* | 8/2017 | Leobandung | H01L 21/823487 |
| 2018/0342618 A1* | 11/2018 | Chen | H01L 21/76897 |
| 2019/0027473 A1* | 1/2019 | Chen | H01L 21/823431 |
| 2019/0148287 A1* | 5/2019 | Chang | H01L 23/485 |
| | | | 257/368 |

OTHER PUBLICATIONS

Swaminathan, Swathi et al.; "A mild deposition of metallic materials on a plastic film enabled by phage display peptide", RSC Advances, 2016, 10 pages.

Willett et al.; "Differential Adhesion of Amino Acids to Inorganic Surfaces"; PNAS; vol. 102, No. 22; May 31, 2005; pp. 7817-7822.

* cited by examiner

SELF-ALIGNED CONTACT ON A SEMICONDUCTOR DEVICE

BACKGROUND

The present invention generally relates to fabrication methods and resulting structures for semiconductor devices. More specifically, the present invention relates to a method for forming a self-aligned contact on a semiconductor device.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. Some nonplanar transistor architectures, such as fin-type field effect transistors (finFETs) and nanosheet field effect transistors (NSFETs), employ semiconductor channels with various replacement metal gate (RMG) and gate-all-around (GAA) technologies to achieve increased device density, greater power efficiency, and some increased performance over lateral devices. In a finFET, for example, a gate runs along the sidewalls and top surface of each semiconductor fin, enabling fuller depletion in the channel region, and reducing short-channel effects due to steeper subthreshold swing (SS) and smaller drain induced barrier lowering (DIBL). FinFET fabrication includes the formation of source/drain metal contacts in a tight contact poly pitch (CPP) or contact gate pitch (CGP) after gate structure. Due to the dimensional limits of nonplanar device structures, an electrical short between the gate and the source/drain metal contact often occurs.

SUMMARY

Embodiments of the present invention are directed to a method for forming a self-aligned contact on a semiconductor device. A non-limiting example of the method includes applying a protective layer on an oxide surface above a source and drain of the semiconductor device. The protective layer covers a top surface of the oxide surface selective to nitride above a gate contact pillar. A sacrificial layer is applied to the nitride surface. The sacrificial layer is deposited only on the nitride surface that is selective to the oxide layer coated with the protective layer. The protective layer is removed from the oxide surface and source/drain contact holes are etched in the oxide surface to form self-aligned contacts on the semiconductor device.

Embodiments of the invention are directed to a semiconductor device. A non-limiting example of the semiconductor device includes a substrate and self-aligned source/drained contact holes etched in oxide formed on the substrate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communication path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, nanosheet semiconductor devices typically include one or more suspended nanosheets that serve as the channel. An epitaxy process is typically performed to grow source/drain epitaxy structures from the surface of the wafer to contact the opposing ends of the nanosheets. A metal source/drain contact is then typically formed on the upper surface of the source/drain epitaxy structure to provide the final source/drain contacts of the device. As fabrication trends aim to continue reducing the footprints of semiconductor devices, the total contact area between the upper surface of the source/drain epitaxy structure and the lower surface of the metal source/drain contact is reduced. As a result, the overall resistance in the source/drain region increases, which can reduce the overall performance of the device.

In a complementary insulated gate FinFET process, such as what is normally referred to as CMOS, layers are formed on a wafer to form the devices on a surface of the wafer. Further, the surface can be the surface of a silicon layer on a silicon on insulator (SOI) wafer. A simple FinFET is formed by the intersection of two shapes, i.e., a gate layer rectangle on a silicon island formed from the silicon surface layer. Each of these layers of shapes, also known as mask levels or layers, can be created or printed optically through well-known photolithographic masking, developing and level definition, e.g., etching, implanting, deposition, etc.

Some approaches consist of etching a contact hole in the contact strap layer (TS), or contact layer, and then filling the hole with a metal to contact the source and drain. The shape of the contact plug is dictated by the shape of the hole, which is usually tapered, yet close to vertical. However, with the current tapered shape of contacts to the source and drain (S/D), it becomes difficult to expect yield for a contact that allows contact resistance in specification, while avoiding bridging at the top of adjacent contacts.

Another issue is performing a uniform, repeatable contact to the S/D areas. With FinFET technology, a contact area typically encompasses a number of fins. Because of process variability and design rules constraints related to crowding at the top of the contacts, design becomes problematic at 14 nm and smaller because the fin located on the edge of the contact receives only partial coverage with the contact metal, thus resulting in an increased resistance.

In another approach, middle of line (MOL) processing for 14 nm FinFET fully encapsulates the gate in nitride. A contact to S/D is etched through oxide, selectively to nitride (TS level). This contact is therefore self-aligned. After TS metallization and CMP, an Inter-Layer Dielectric (ILD) film is deposited, and the S/D contact to TS and gate contact are processed. However, the S/D and gate contacts are not self-aligned, and thus susceptible to shorting.

It can be challenging to etch self-aligned S/D contacts through an oxide selective to nitride cap in nanosheet flow. Current methods use a cyclic oxide etch process to gain selectivity to nitride, but such a process is not sufficient to prevent nitride erosion. Also, with further reduction of pitch in future generations, it will become even more difficult to maintain selectivity while etching a narrow contact in oxide. Furthermore, gaining selectivity between oxide and nitride can be challenging using traditional methods, because the two materials cannot be easily distinguished between one another.

Turning now to an overview of the aspects of the invention, one or more embodiments of the invention address the above-described shortcomings of the prior art by providing a method of forming one or more self-aligned contacts on a semiconductor device and a semiconductor device containing one or more self-aligned contacts. The one or more self-aligned contacts contain a layer of metal or a layer of a metal oxide or metal nitride as a mask deposited selectively on nitride. Selective deposition of a metal layer or a metal oxide or metal nitride layer mask can be enabled after applying a protective layer on an oxide surface above a source and drain and on a nitride surface above a gate contact pillar of the semiconductor device. The protective layer can attach to the top surface of the oxide selective to nitride. Unadsorbed portions of the protective layer can then be selectively removed from the nitride surface. The protective layer remaining on oxide can then prevent the deposition of a sacrificial metal layer or a metal oxide or a metal nitride mask layer in a subsequent step. This allows for selective deposition of a sacrificial layer only on nitride thereby allowing the formation of one or more self-aligned contacts. The protective layer is selective to only nitride such the method forms one or more self-aligned contacts where the protective layer selectively deposits on nitride only. Stated another way, the sacrificial layer on nitride can restrict contact hole formation to oxide, allowing self-aligned contact formation.

The above-described aspects of the invention address the shortcomings of the prior art with the presently claimed method and semiconductor device incorporating a protective layer which prevents metal, metal oxide, or metal nitride layers from depositing to an oxide surface. Such a method allows self-aligned contacts to be formed on the semiconductor device. The present method allows for the formation of self-aligned contacts without the formation of a shoulder in the nitride layer or nitride erosion.

Embodiments disclosed herein provide approaches for forming gate and source/drain (S/D) contacts. Specifically, the semiconductor device includes a gate contact opening formed over at least one of a set of gate structures, a set of S/D contact openings formed over fins of the semiconductor device, and a metal material deposited over the semiconductor device to form a gate contact within the gate contact opening and a set of S/D contacts within the set of S/D contact openings. The S/D contacts are self-aligned. In one approach, a layer of oxide and nitride remains between the gate contact and at least one of the set of S/D contacts following formation. This scheme is compatible with a source-drain contact replacement scheme and, in addition, provides a way to self-align the gate contact so that any risk of shorting the gate contact and the S/D contacts is eliminated by the inclusion of the protective layer.

The method can include forming one or more self-aligned contacts on a semiconductor device. A protective layer can be applied on an oxide surface above a source and drain of the semiconductor device. The protective layer can cover a top surface of the oxide surface, where the protective layer attaches to oxide selective to a nitride surface disposed above a gate contact pillar. Unadsorbed portions of the protective layer on the nitride surface can then be selectively removed. A sacrificial layer can be applied to the nitride surface. The sacrificial layer is deposited only on the nitride surface that is selective to the oxide layer coated with the protective layer. The protective layer is removed from the oxide surface and source/drain contact holes are etched in the oxide surface to form self-aligned contacts on the semiconductor device.

Figure 1:
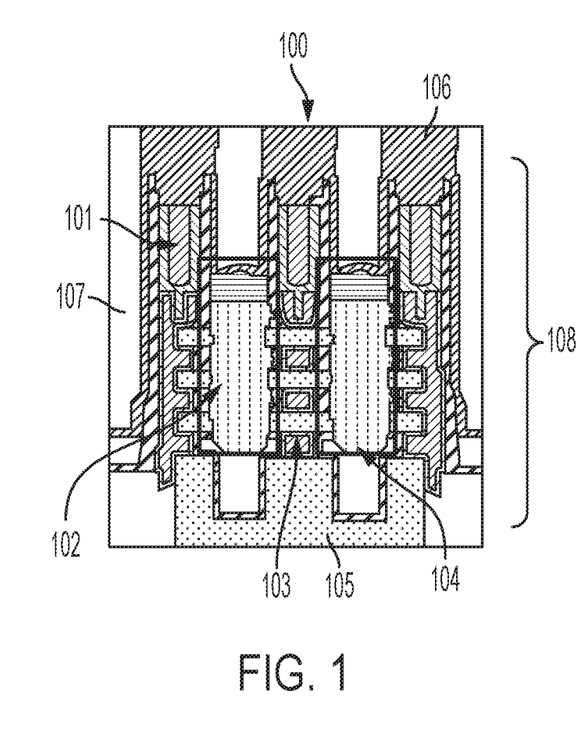
FIG. 1 depicts a semiconductor device for which a self-aligned contact can be formed according to aspects of the invention.

Turning now to a more detailed description of aspects of the present invention, FIGS. 1 to 10 depict a process flow for self-aligned contact formation according to embodiments of the invention. A semiconductor device 100 is shown in FIG. 1 with a source 102, a device 103 (e.g., a stacked finFET device with a gate all around), and a drain 104 disposed on a substrate 105. The source 102 and drain 104 can include alternating layers of materials such as silicon and silicon germanium.

The term "substrate" used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate can include a semiconductor wafer (e.g., silicon, SiGe, or an SOI wafer) or one or more die on a wafer, and any epitaxial layers or other type semiconductor layers formed thereover or associated therewith. A portion or the entire semiconductor substrate can be amorphous, polycrystalline, or single-crystalline. The semiconductor substrate can be doped, undoped or contain doped regions and undoped regions therein. The semiconductor substrate can contain regions with strain and regions without strain therein, or contain regions of tensile strain and compressive strain.

Also shown in FIG. 1 is a nitride layer 106 above a gate contact 101 with a nitride surface and an oxide layer 107 with an oxide surface filling spaces in between the gate contact 101. A gate contact pillar 108 includes these features. The gate contact 101 is filled with metal, e.g., titanium nitride (TiN) or tungsten (W). In the formation of one or more self-aligned S/D contacts, it can be important to protect the nitride layer 106 to prevent S/D contact shorting with an adjacent gate.

Figure 2:
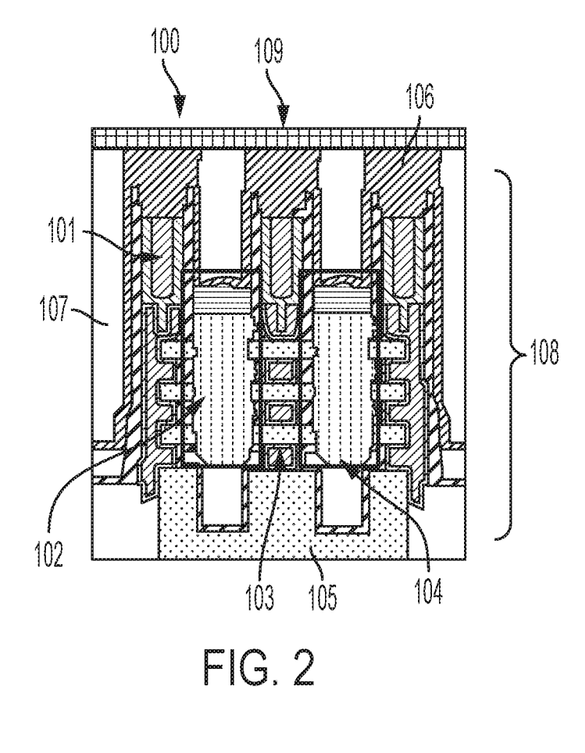
FIG. 2 depicts the semiconductor device of FIG. 1 after a protective layer is applied according to aspects of the invention.

In FIG. 2, a protective layer 109 has been applied on the oxide surface above the source 102 and the drain 104. The protective layer 109 can have a thickness of 20 Å to 500 Å. The protective layer 109 can include a polypeptide. The polypeptide can be configured to selectively bind to the oxide layer 107 as opposed to the nitride layer 106. The oxide layer 107 can include silicon oxide, while the nitride layer 106 can include silicon nitride. Accordingly, the protective layer 109 is configured to selectively bind to silicon oxide over silicon nitride.

Figure 3:
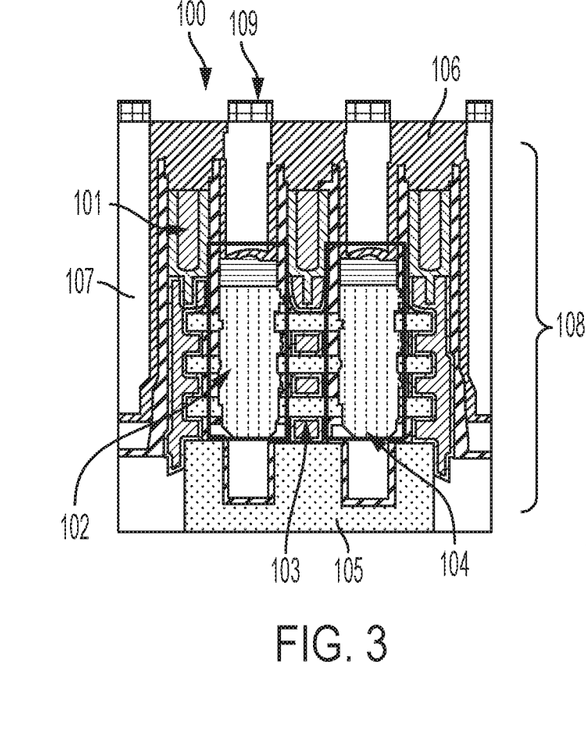
FIG. 3 depicts the semiconductor device of FIG. 2 after portions of the protective layer are removed according to aspects of the invention.

Unattached or unadsorbed portions of the protective layer 109 are removed from the nitride surface by rinsing as shown in FIG. 3. The rinsing can occur with distilled water, deionized water, phosphate buffered saline (PBS), or a combination including at least one of the foregoing.

Figure 4:
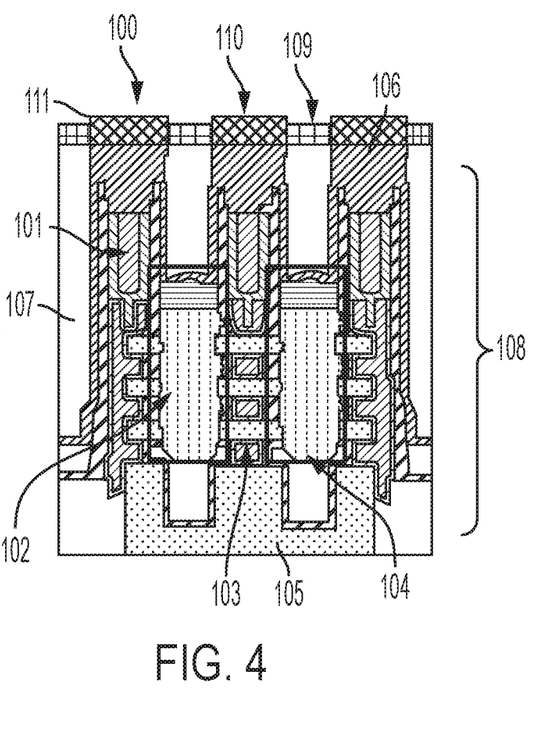
FIG. 4 depicts the semiconductor device of FIG. 3 after a sacrificial layer is applied according to aspects of the invention.

In FIG. 4, a sacrificial layer 110 is deposited on the nitride surface. As shown in FIG. 4, the sacrificial layer 110 is deposited only on a portion 111 of the nitride surface selective to the oxide layer 107 coated with the protective layer 109. The sacrificial layer 110 can include a metal, a metal oxide, a metal nitride, or a combination including at least one of the foregoing. For example, the metal can include titanium, tantalum, tin, or a combination including at least one of the foregoing. The metal oxide can include titanium oxide, tantalum oxide, tin oxide, hafnium oxide, or a combination including at least one of the foregoing. The metal nitride can include titanium nitride, tantalum nitride, tin nitride, hafnium nitride, or a combination including at least one of the foregoing. In an embodiment, a sacrificial material is deposited using an atomic layer deposition (ALD) process.

The protective layer 109 can be configured to prevent the sacrificial layer 111 from depositing on the oxide surface of the oxide layer 107.

Figure 5:
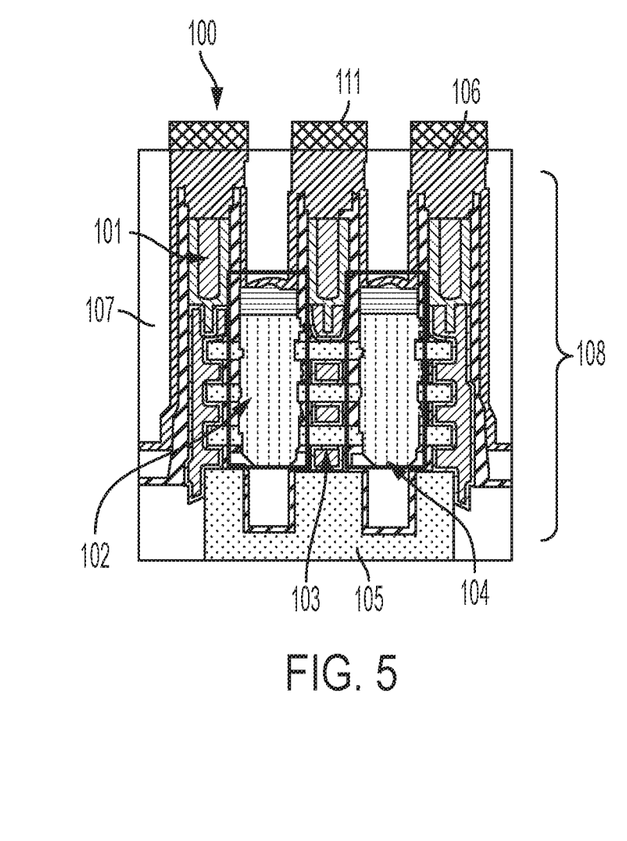
FIG. 5 depicts the semiconductor device of FIG. 4 after the protective layer is removed according to aspects of the invention.

Turning now to FIG. 5, the protective layer 109 is removed from the oxide layer 107. The protective layer 109 can be removed by rinsing with a solution. For example, the solution can be a high pH solution (e.g., pH of 10-14). In an embodiment, the solution can include an aqueous base, such as but not limited to ammonium hydroxide (NH$_4$OH), aqueous sodium hydroxide (NaOH) or aqueous potassium hydroxide (KOH).

Figure 6:
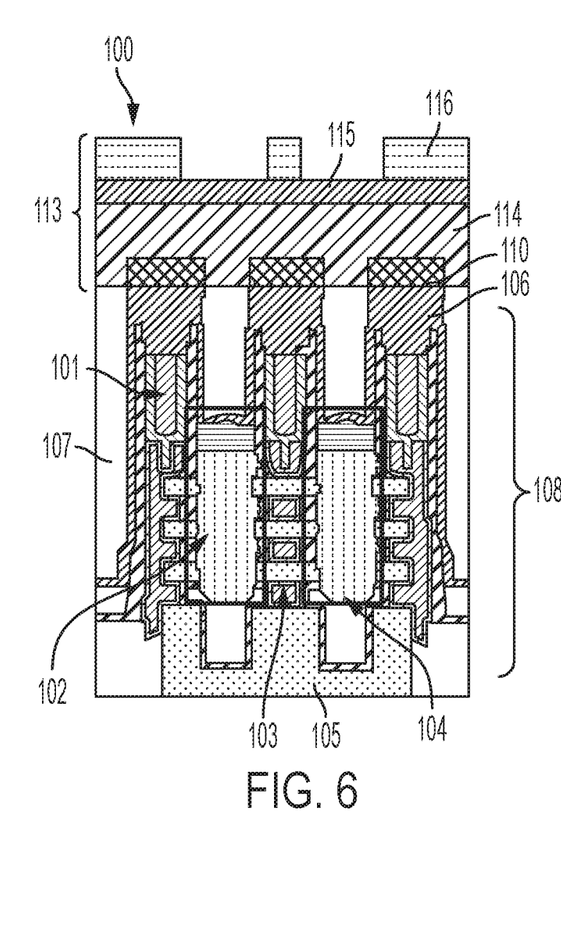
FIG. 6 depicts the semiconductor device of FIG. 5 after a stack is deposited according to aspects of the invention.

In FIG. 6, a stack 113 is deposited to define a lithography pattern of a source/drain contact. The stack includes an organic planarizing layer 114, a hardmask layer 115, and a photoresist layer 116. The planarizing layer 114 includes standard organic planarizing material used in lithographic patterning of a high carbon containing substrate that can be spin on (commercially available spin ODL 401) or a deposited film such as amorphous carbon. The hardmask layer 115 includes SiARC, silicon nitride, silicon oxide, silicon oxynitride etc. The photoresist layer 116 includes standard 193 nm photoresist or EUV photoresist.

Figure 7:
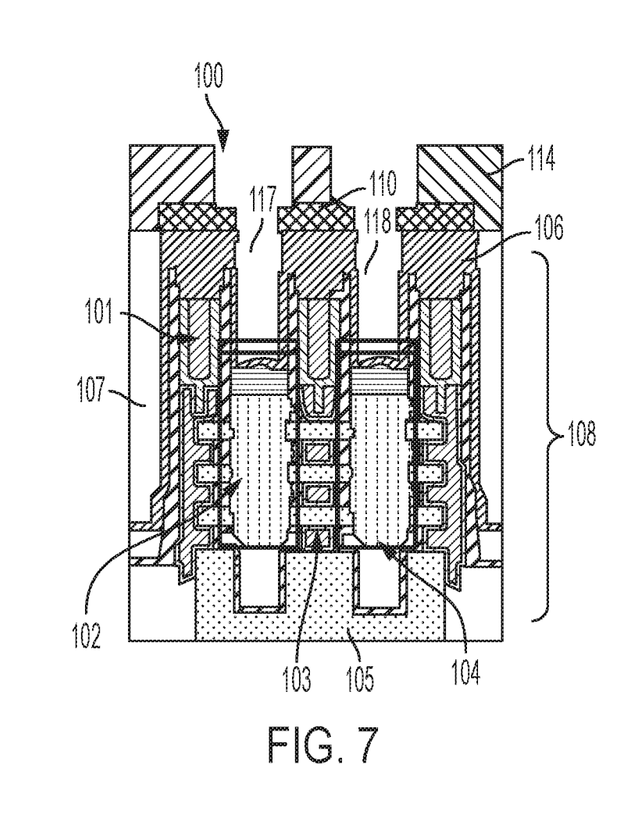
FIG. 7 depicts the semiconductor device of FIG. 6 after source/drain contact holes are formed according to aspects of the invention.
Figure 8:
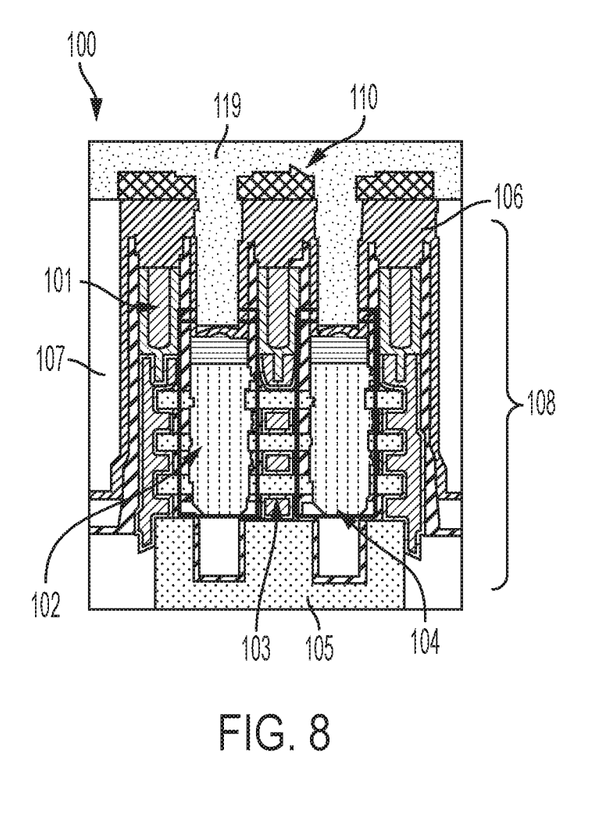
FIG. 8 depicts the semiconductor device of FIG. 7 after the source/drain contact holes are filled with a conducting material according to aspects of the invention.

In FIG. 7, source/drain contact holes 117, 118 are etched into the oxide layer 107 to form self-aligned contacts on the semiconductor device 100. The sacrificial layer 110 prevents etching of nitride 106 underneath and confines the contact formation in oxide self-aligning the contact with source and drain. The source/drain contact holes 117, 118 can be filled with a conducting material 119 as shown in FIG. 8. The conducting material can include a metal. The metal can include tungsten, cobalt, copper, aluminum, ruthenium, or a combination including at least one of the foregoing. Metal deposition methods can include but are not limited to, chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, spin-on methods, physical vapor deposition (PVD), atomic layer deposition (ALD) etc.

Figure 9:
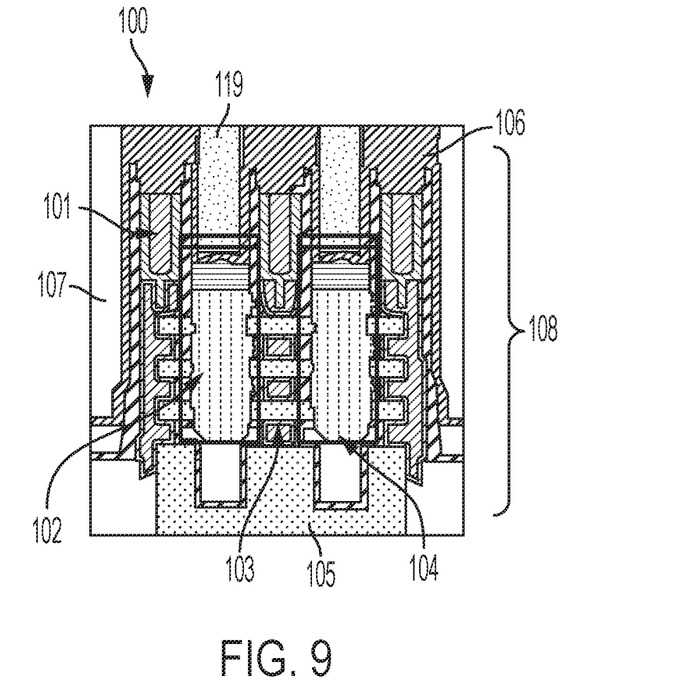
FIG. 9 depicts the semiconductor device of FIG. 8 after the sacrificial layer and the conducting material are removed according to aspects of the invention.

In FIG. 9, the sacrificial layer 110 is removed along with a portion of the conducting material 119. The sacrificial layer 110 and conducting material 119 can be removed by any process, including, but not limited to a chemical mechanical polishing CMP) process.

Figure 10:
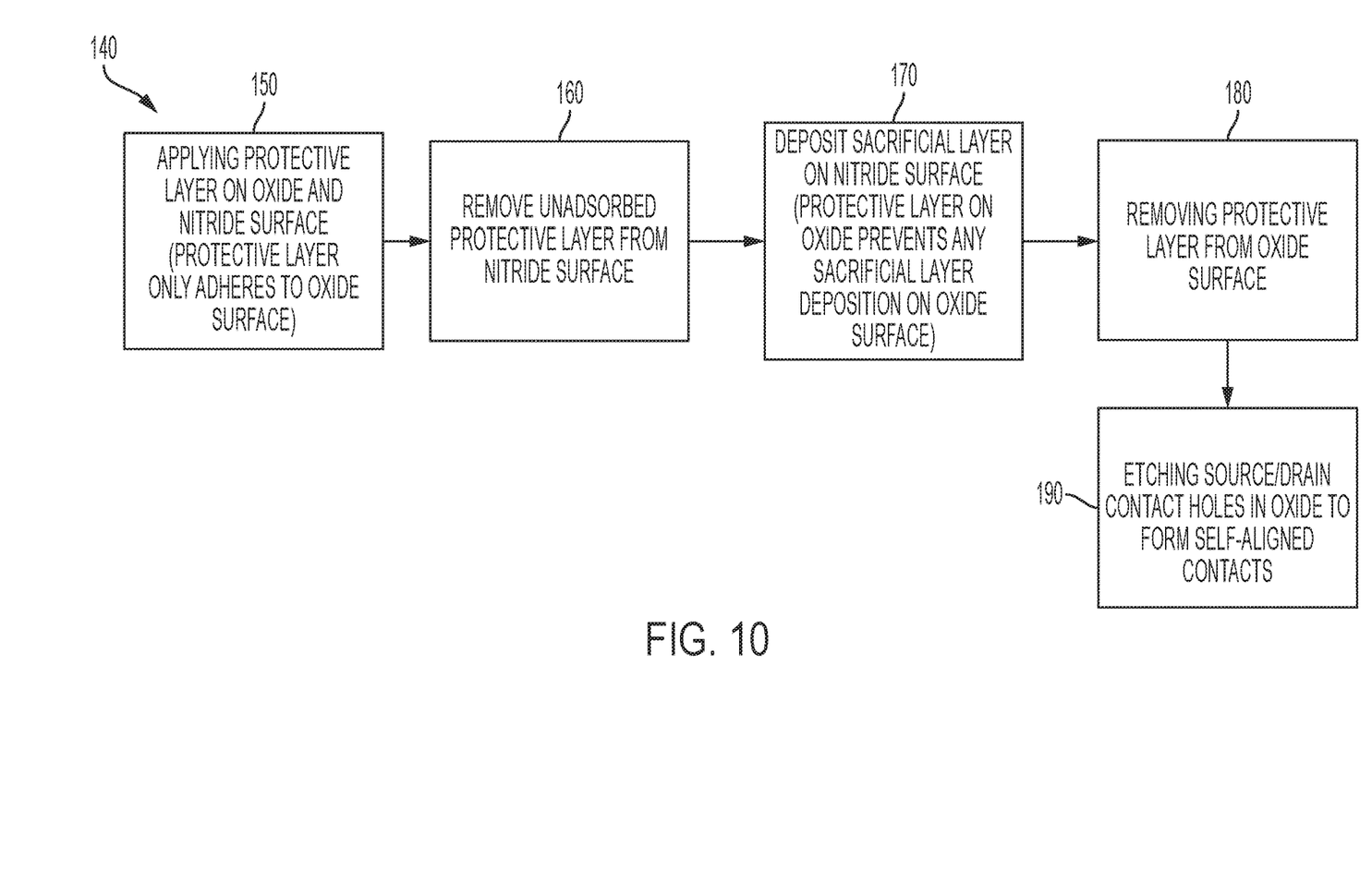
FIG. 10 depicts a flow diagram illustrating a method according to one or more embodiments of the invention.

A method 140 of forming the semiconductor device is shown in FIG. 10 where a protective layer can be applied on both an oxide surface and a nitride surface above a source, drain and gate contact of the semiconductor device at 150. The protective layer adheres to the oxide surface above the source and drain selective to the nitride surface above a gate contact pillar. Unadsorbed portions of the protective layer is removed from the nitride surface at 160. A sacrificial layer is then deposited on the nitride surface at 170. The sacrificial layer is deposited only on the nitride surface since the protective layer on oxide prevents deposition of the sacrificial layer on the oxide surface. The protective layer is removed from the oxide surface at 180 and source/drain contact holes are etched in the oxide surface to form self-aligned contacts on the semiconductor device at 190.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming one or more self-aligned contacts on a semiconductor device, the method comprising:
    applying a protective layer on an oxide surface above a source and drain of the semiconductor device, wherein the protective layer covers a top surface of the oxide surface selective to a nitride surface above a gate contact pillar;
    wherein the protective layer comprises a polypeptide comprising a protective layer material configured to selectively bind to the oxide surface over the nitride surface;
    applying a sacrificial layer on the nitride surface, wherein the sacrificial layer is deposited only on the nitride surface selective to the oxide surface coated with the protective layer;
    removing the protective layer from the oxide surface; and
    etching source/drain contact holes on the oxide surface to form self-aligned contacts on the semiconductor device.

2. The method of claim 1, wherein the protective layer material comprises a polypeptide.

3. The method of claim 2, wherein the polypeptide is configured to selectively bind to silicon oxide over silicon nitride.

4. The method of claim 1, wherein an unadsorbed portion of the protective layer is removed from the nitride surface by rinsing with distilled water, deionized water, phosphate buffered saline, or a combination comprising at least one of the foregoing.

5. The method of claim 1, wherein the sacrificial layer comprises a metal, a metal oxide, a metal nitride or a combination comprising at least one of the foregoing.

6. The method of claim 5, wherein the metal comprises titanium, tantalum, tin, or a combination comprising at least one of the foregoing and the metal oxide/metal nitride comprises titanium oxide/nitride, tantalum oxide/nitride, tin oxide/nitride, hafnium oxide, or a combination comprising at least one of the foregoing.

7. The method of claim 6, wherein the protective layer is configured to prevent the metal, metal oxide, or metal nitride from attaching to the oxide surface.

8. The method of claim 6, wherein the metal oxide comprises silicon oxide.

9. The method of claim 6, wherein the metal nitride comprises silicon nitride.

10. The method of claim 1 further comprising removing the protective layer above the oxide using a high pH solution.

11. The method of claim 10, wherein the pH of the solution is 10-14.

12. The method of claim 1 further comprising depositing a stack for defining a lithography pattern of the source/drain contact, wherein the stack comprises an organic planarizing layer, a hardmask layer, and a photoresist layer.

13. The method of claim 1 further comprising filling the source/drain contact holes with a conducting material.

14. The method of claim 13, wherein the conducting material comprises a metal, wherein the metal comprises tungsten, cobalt, copper, aluminum, ruthenium, or a combination comprising at least one of the foregoing.

15. The method of claim 13 further comprising removing the protective layer and a portion of the conducting material by a chemical mechanical planarization process.

16. A semiconductor device comprising:
a substrate; and
self-aligned source/drain contact holes etched on an oxide surface formed on the substrate; wherein a protective layer comprising a polypeptide selectively binds to the oxide surface above the source/drain contact holes; wherein a sacrificial layer selectively binds to a surface above the source/drain contact holes where the oxide surface is absent.

17. The semiconductor device of claim 16 further comprising a conducting material deposited in the self-aligned source/drain contact holes.

18. The semiconductor device of claim 16, wherein the conducting material comprises a metal selected from the group consisting of tungsten, cobalt, copper, aluminum, ruthenium, or a combination comprising at least one of the foregoing.

* * * * *